(12) United States Patent
Fernald

(10) Patent No.: US 9,160,166 B2
(45) Date of Patent: Oct. 13, 2015

(54) CHARGE PUMP FOR LOW POWER CONSUMPTION APPARATUS AND ASSOCIATED METHODS

(71) Applicant: Silicon Laboratories Inc., Austin, TX (US)

(72) Inventor: Kenneth W Fernald, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 478 days.

(21) Appl. No.: 13/720,132

(22) Filed: Dec. 19, 2012

(65) Prior Publication Data
US 2014/0167509 A1    Jun. 19, 2014

(51) Int. Cl.
     *H02J 1/00*      (2006.01)
     *H02J 7/00*      (2006.01)
     *G11C 5/14*      (2006.01)

(52) U.S. Cl.
CPC . *H02J 1/00* (2013.01); *G11C 5/145* (2013.01); *H02J 7/0063* (2013.01); *Y10T 307/406* (2013.01)

(58) Field of Classification Search
CPC ...... H02J 1/00; H02J 7/0063; Y10T 307/406; G11C 5/145
USPC .......................................................... 307/31
See application file for complete search history.

(56) References Cited

U.S. PATENT DOCUMENTS

| | | | |
|---|---|---|---|
| 2007/0081366 A1* | 4/2007 | Stahl | 363/59 |
| 2010/0328286 A1* | 12/2010 | Piasecki et al. | 345/211 |
| 2011/0128070 A1* | 6/2011 | Pagano et al. | 327/536 |
| 2011/0279096 A1* | 11/2011 | Sonntag | 320/166 |

* cited by examiner

*Primary Examiner* — Scott Bauer
(74) *Attorney, Agent, or Firm* — Law Offices of Maximilian R. Peterson

(57) ABSTRACT

An apparatus includes a first set of circuits adapted to operate in a first mode of operation of the apparatus. The apparatus further includes a second set of circuits adapted to operate in a second mode of operation of the apparatus, where a power consumption of the apparatus is lower in the second mode of operation of the apparatus than in the first mode of operation of the apparatus. The apparatus also includes a charge pump adapted to convert a first supply voltage of the apparatus to a second supply voltage, and the second supply voltage powers the second set of circuits.

20 Claims, 7 Drawing Sheets

CHARGE PUMP FOR LOW POWER CONSUMPTION APPARATUS AND ASSOCIATED METHODS

TECHNICAL FIELD

The disclosure relates generally to power converter apparatus and related methods. More particularly, the disclosure relates to charge pumps for providing supply voltages to low power apparatus, and associated methods.

BACKGROUND

Modern ICs have helped to integrate electronic circuitry to decrease size and cost. As a consequence, modern ICs can form complex circuitry and systems. For example, virtually all of the functionality of a system may be realized using one or a handful of ICs. Such circuitry and systems may receive and operate on both analog and digital signals, and may provide analog and digital signals.

The result has been a growing trend to produce circuitry and systems with increased numbers of transistors and similar devices. The growth in the number of devices usually leads to an increase in power consumption or power dissipation. Even for a device with a relatively modest number of devices, the power consumption may place a drain on the power source.

SUMMARY

An apparatus according to one exemplary embodiment includes a first set of circuits adapted to operate in a first mode of operation of the apparatus. The apparatus further includes a second set of circuits adapted to operate in a second mode of operation of the apparatus, where a power consumption of the apparatus is lower in the second mode of operation of the apparatus than in the first mode of operation of the apparatus. The apparatus also includes a charge pump adapted to convert a first supply voltage of the apparatus to a second supply voltage, and the second supply voltage powers the second set of circuits.

According to another exemplary embodiment, an apparatus includes a battery, and a microcontroller unit (MCU). The MCU includes a charge pump coupled to the battery. The charge pump is adapted to convert a voltage of the battery to a supply voltage. The supply voltage is lower than the battery voltage. The MCU also includes a first set of circuits adapted to be powered by the battery during a normal operating mode of the MCU. The MCU further includes a second set of circuits coupled to the charge pump. The second set of circuits is adapted to be powered by the supply voltage during a low-power operating mode of the MCU According to yet another exemplary embodiment, a method of operating an apparatus includes converting, by using a charge pump, a first supply voltage of the apparatus to a second supply voltage. The method also includes operating a first set of circuits in a first mode of operation of the apparatus. The method further includes operating a second set of circuits in a second mode of operation of the apparatus, using the second supply voltage to power the second set of circuits, where the power consumption of the apparatus is lower in the second mode of operation of the apparatus than in the first mode of operation of the apparatus.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

In various embodiments an apparatus may be provided to provide power to circuitry operating in a relatively low power mode, yet in an efficient manner. More specifically, the disclosure relates to apparatus and methods for using charge pumps to supply power to circuitry that is operational in a low power mode, such as a sleep mode, with relatively high efficiency.

Figure 1:
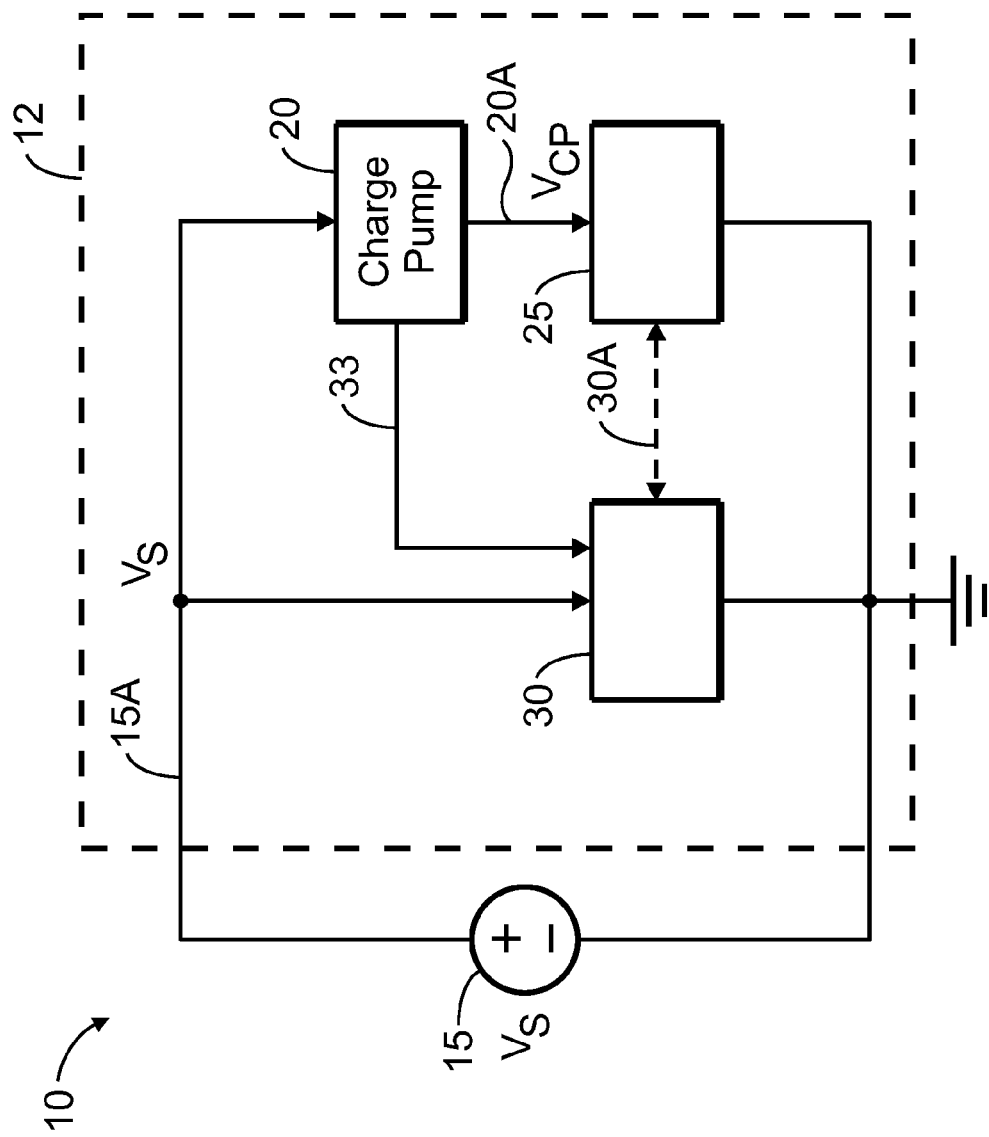
FIG. 1 illustrates an apparatus that includes a charge pump for supplying power to a set of circuits according to an exemplary embodiment.

FIG. 1 shows an apparatus that includes a charge pump for supplying power to a set of circuits according to an exemplary embodiment. Broadly speaking, a set of circuits in FIG. 1, such as the set of circuits labeled as 30, may correspond to an active or normal mode of operation of apparatus 10, i.e., they are operational during the active or normal mode of operation. During the low power or sleep mode of operation, however, circuits 30 may be inactivated, put in a sleep mode, etc.

Without limitation, circuits 30 may include a variety of circuitry, such as controllers, memory, processor circuitry, clock generation and distribution circuits, power management circuitry, supervisory circuitry, input/output circuitry, and the like. Generally, circuits 30 may include any type or variety of circuit that is desired to be functioning during the active or normal mode of operation, but inactive during a low power or sleep mode of operation.

Apparatus 10 includes another set of circuits, such as the set of circuits labeled as 25. Circuits 25 may correspond to a low power mode (compared to the normal or active mode) or sleep mode of operation of apparatus 10. In other words, circuits 25 are operational during a low power or sleep mode of operation (as well as during the normal or active mode of operation). Without limitation, circuits 25 may include state-retained memory; universal asynchronous receiver transmitter (UART); registers; real time clock (RTC) circuitry; display circuitry, such as a liquid crystal display (LCD) controller; etc.

Note that, in some embodiments, part of a circuit may be desired to be available during the active mode of apparatus 10, while another part of the circuit may be desired to function in a low power or sleep mode for at least some of the time. For example, RTC circuitry (not shown in FIG. 1) may include analog circuitry that is included in circuits 25 (to keep the clock running), and digital circuitry that may be included in circuits 30. Other examples of such circuitry exist, as persons of ordinary skill in the art understand, depending on the specifications and desired performance or functionality of a given implementation.

In some embodiments, circuits 30 (e.g., controller 45 or other parts of circuits 30) may communicate with circuits 25. In the exemplary embodiment of FIG. 1, such communication may take place via link 30A. Using link 30A, circuits 25 and 30 may communicate information, such as data, control signals, status signals, clock signals, and the like, as desired. As merely one example, circuits 30 may include a processor or controller that may use link 30A to provide information to an LCD controller included as part of circuits 25. As persons of ordinary skill in the art understand, depending on factors like the nature of the communication information and the specification of a particular implementation, link 30A may include one or more wires, conductors, and the like.

Source 15 supplies power to various circuits in apparatus 10. More specifically, source 15 provides supply voltage $V_s$ to circuits 30. Apparatus 10 includes charge pump 20, which via supply line 15A receives supply voltage $V_s$ from source 15. Charge pump 20 converts or scales supply voltage $V_s$ to an output voltage $V_{cp}$, that is lower than supply voltage $V_s$. Thus, charge pump 20 has a voltage conversion factor, K, associated with it, such that $K=V_{cp}/V_s$. In some embodiments, K may have a value of approximately 0.5, i.e., the charge pump output voltage is given by $V_{cp} \approx 0.5\ V_s$, with such a charge pump sometimes called a "half mode" charge pump.

In some embodiments, one or more circuits included in circuits 30 may control the operation of charge pump 20. In the embodiment shown in FIG. 1, link 33 provides a mechanism for providing one or more control signals to charge pump 20. If desired, link 33 may provide communication from the charge pump to circuits 30, as persons of ordinary skill in the art understand.

According to one aspect of the disclosure, in some embodiments, circuits 25 and 30 and charge pump 20 may be integrated into a single integrated circuit (IC), labeled 12 in FIG. 1. Integrating one or more of the circuits described above can improve the overall performance in some applications, for example, flexibility, responsiveness, die area, cost, materials used, power consumption, reliability, robustness, and the like, as desired.

According to another aspect of the disclosure, in some embodiments, apparatus 10 may constitute a portable apparatus. In such situations, source 15 may constitute a battery. In other embodiments, even where apparatus 10 is semi-portable or non-portable, or where using other power sources might be inconvenient, source 15 may nevertheless be a battery. Use of the battery overcomes provision of power through other means, such as wires or cables coupled to other sources, such as the mains and associated power conversion circuitry. In some embodiments, whether portable or not, source 15 may constitute a renewable energy or power source, for example, a solar panel (and associated power processing circuitry, as desired).

Figure 2A:
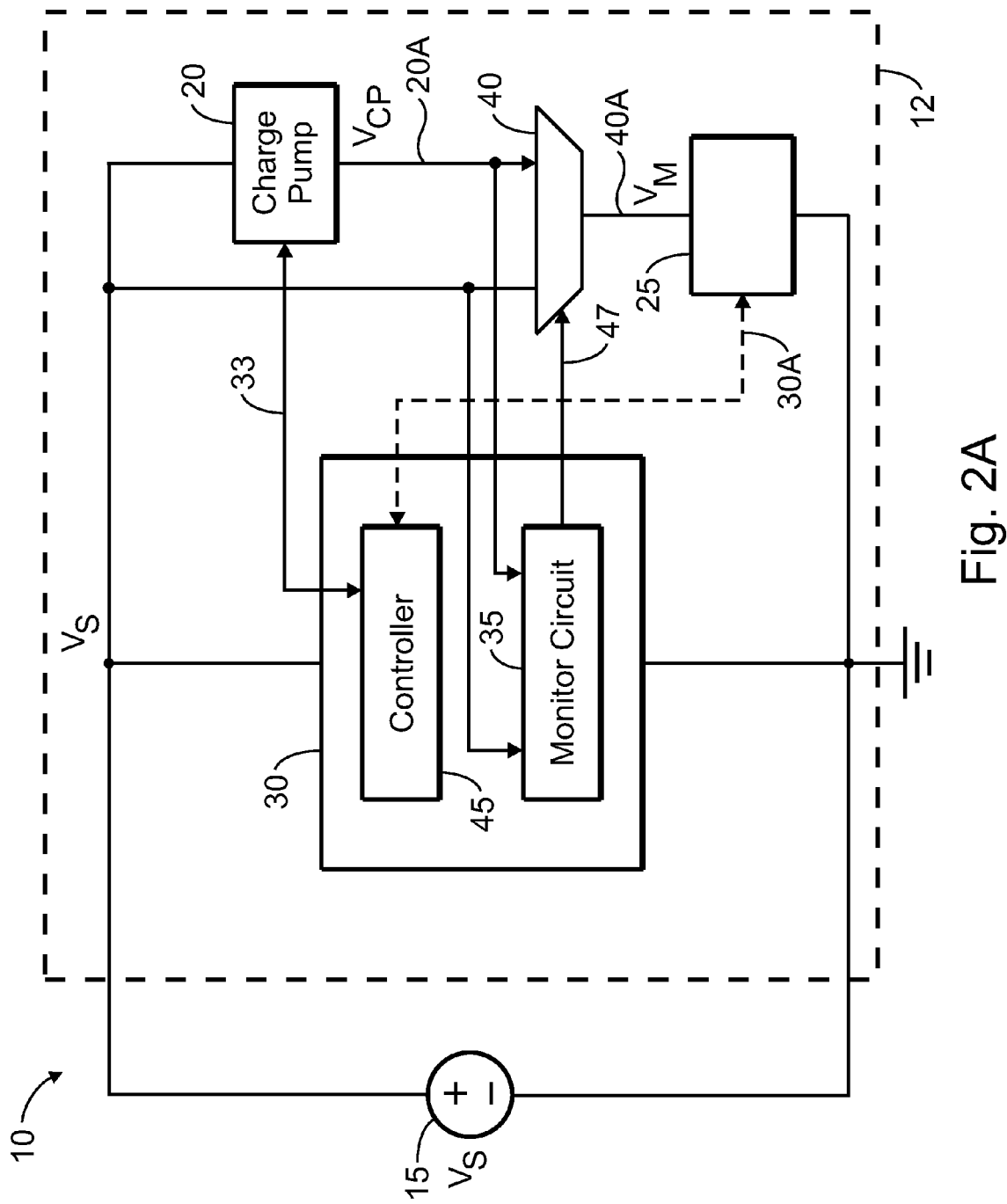
FIGS. 2A-2B show more detailed block diagrams of apparatus according to exemplary embodiments.
Figure 2B:
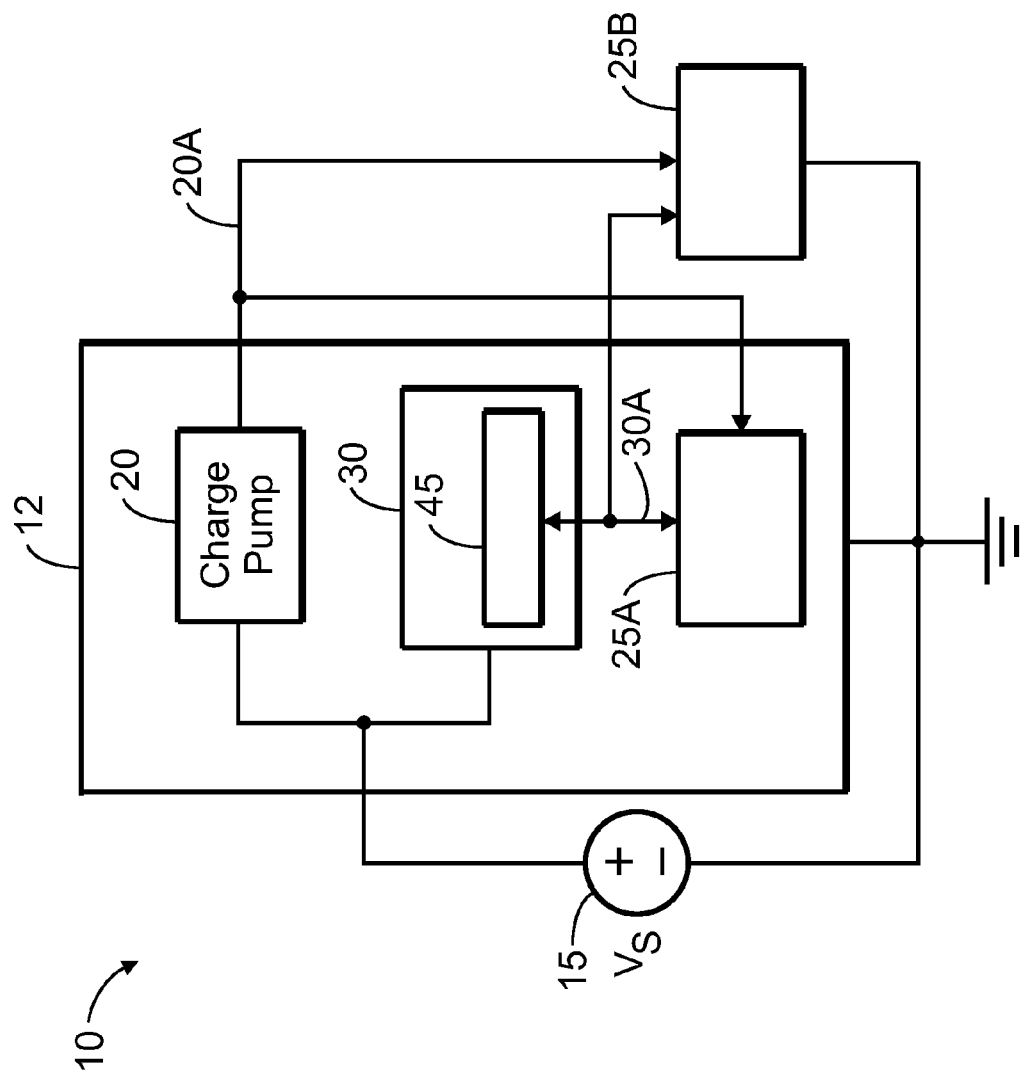

FIGS. 2A-2B show more detailed block diagrams of apparatus 10 according to exemplary embodiments. Referring to FIG. 2A, apparatus 10 includes a multiplexer (MUX) 40 or, generally, a controlled switch (e.g., a single pole dual throw (SPDT) switch) to control provision of power to circuits 25. More specifically, the inputs of MUX 40 receive $V_s$ and $V_{cp}$, respectively. In response to control signal 47, MUX 40 provides either $V_s$ or $V_{cp}$ to circuits 25. In other words, one may selectively supply either $V_s$ or $V_{cp}$ to circuits 25.

This capability allows more flexibility in providing a source of power to circuits 25. Consider the situation where source 15 is a battery, or where the voltage and/or power provided by source 15 fluctuate over time or decrease over time. When source 15 provides a sufficiently high value of $V_s$ that the output voltage of charge pump 20, $V_{cp}$, meets the specified supply voltage of circuits 25, MUX 40 provides $V_{cp}$ to circuits 25. If the value of $V_s$ changes such that $V_{cp}$ is no longer suitable for powering circuits 25 (e.g., $V_s$ falls below a specific value), MUX 40 provides $V_s$ to circuits 25.

Monitor circuit 35, included as part of circuits 30, provides control signal 47 (the select signal for MUX 40 in the embodiment shown). Monitor circuit 35 receives as inputs the voltages $V_s$ and $V_{cp}$. As described above, depending at least one of (or both) of the input voltages ($V_s$ and $V_{cp}$), or depending on the relative values of the input voltages (or depending on another desired control scheme), monitor circuit 35 drives control signal 47 to appropriately provide power to circuits 25. In other embodiments, monitor circuit 35 may receive the output voltage of MUX 40, labeled $V_M$ in FIG. 2A, and use this voltage when determining the appropriate state of control signal 47.

In some embodiments, circuits 30 include one or more of controller 45. Referring to FIG. 2A, which shows one controller, controller 45 may provide desired information or data processing capabilities, including without limitation, numerical calculation capability. Controller 45 may perform any desired processing or calculation in IC 12.

In exemplary embodiments, controller 45 may constitute a controller, microcontroller, processor, microprocessor, field-programmable gate array (FPGA), programmable controller, or the like, as desired. Without limitation, in exemplary embodiments, controller 45 may include one or more of integrated random access memory (RAM), including program RAM, as desired, read only memory (ROM), non-volatile memory (NVM), such as flash memory, one-time programmable (OTP) circuitry, analog-to-digital converters (ADCs), digital-to-analog-converters (DACs), counters, timers, input/output (I/O) circuitry and controllers, arithmetic circuitry (e.g., adders, subtracters, multipliers, dividers), general and programmable logic circuitry, power regulators, and the like, as desired.

In some embodiments, rather than driving MUX 40 (or another switch or type of switch), monitor circuit 35 may interrupt or otherwise cause controller 45 to decide whether to supply $V_s$ or $V_{cp}$ to circuits 25. In such embodiments, controller 45 may be programmed, for example, by using associated software or firmware, to control the supply of power to circuits 25 using a variety of criteria or considerations, for example, input from sensors, input from external sources, etc.

In addition to controller 45, in some embodiments, IC 12 may include one or more of other circuitry, such as a power-on reset (POR) circuit, power management unit (PMU), host interface circuitry, brownout detector, watchdog timer, and the like. In some embodiments, one or more of the above circuits may be included in controller 45, as desired, or may be included in circuits 25.

According to one aspect of the disclosure, in some embodiments, part of a circuit or block may be included in circuits 25, and another part of the circuit or block may be included in circuits 30. For example, part of circuitry associated with displaying information on an LCD may be included in circuits 25, so that the LCD can display information during all times or during desired times. Other LCD circuitry, on the other hand, may be included as part of circuits 30. Thus, during the low power or sleep mode of operation of apparatus 10, the LCD may display static information, whereas during the normal or active mode of operation, the other LCD circuitry is powered (as part of circuits 30), and provides information to the LCD, for example, as requested by controller 45.

According to another aspect of the disclosure, in some embodiments, part of a circuit or block may be included in circuits 25A, integrated in IC 12, and another part of the circuit or block may be included in circuits 25B, external to IC 12. FIG. 2B shows such an arrangement according to an exemplary embodiment. As an example, and without limitation, in some embodiments, circuitry associated with an LCD may be included in circuits 25A, whereas the LCD itself may be included in circuits 25B (external to IC 12). A variety of other arrangements may be used according to other embodiments, as persons of ordinary skill in the art understand.

Note that, rather than using one link 30A, as shown in the example in FIG. 2B, separate links may be used between circuit 30 (controller 45 or other part of circuits 30) and circuits 25A and 25B, respectively. Using such link(s) circuits 25A and 25B may communicate information, such as data, control signals, status signals, clock signals, and the like, as desired.

Figure 3:
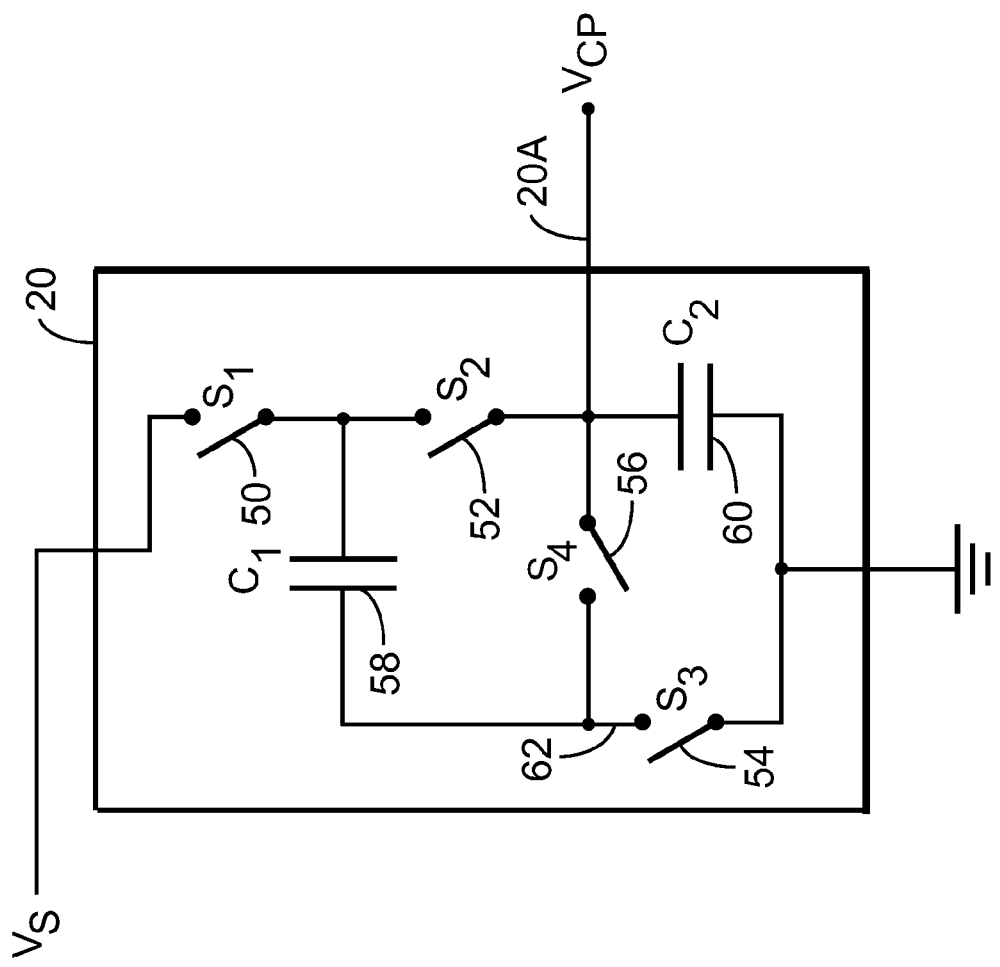
FIG. 3 shows a circuit arrangement for a charge pump for use in exemplary embodiments.

FIG. 3 shows a circuit arrangement for a charge pump 20 for use in exemplary embodiments. Charge pump 20 includes four switches 50, 52, 54, and 56, labeled $S_1$-$S_4$, respectively. In addition, charge pump 20 includes capacitors 58 and 60, labeled $C_1$-$C_2$, respectively. Switches 50, 52, 54, and 56 constitute controlled or controllable switches. In other words, in response to control signals (not shown), switches 50, 52, 54, and 56 may be opened or closed.

In exemplary embodiments, switches 50, 52, 54, and 56 may be implemented as transistors, for example, metal oxide semiconductor (MOS) transistors. As persons of ordinary skill in the art understand, however, a variety of other devices may be used, depending on factors such as design and performance specifications, available fabrication technology, etc., for a given implementation.

Figure 4:
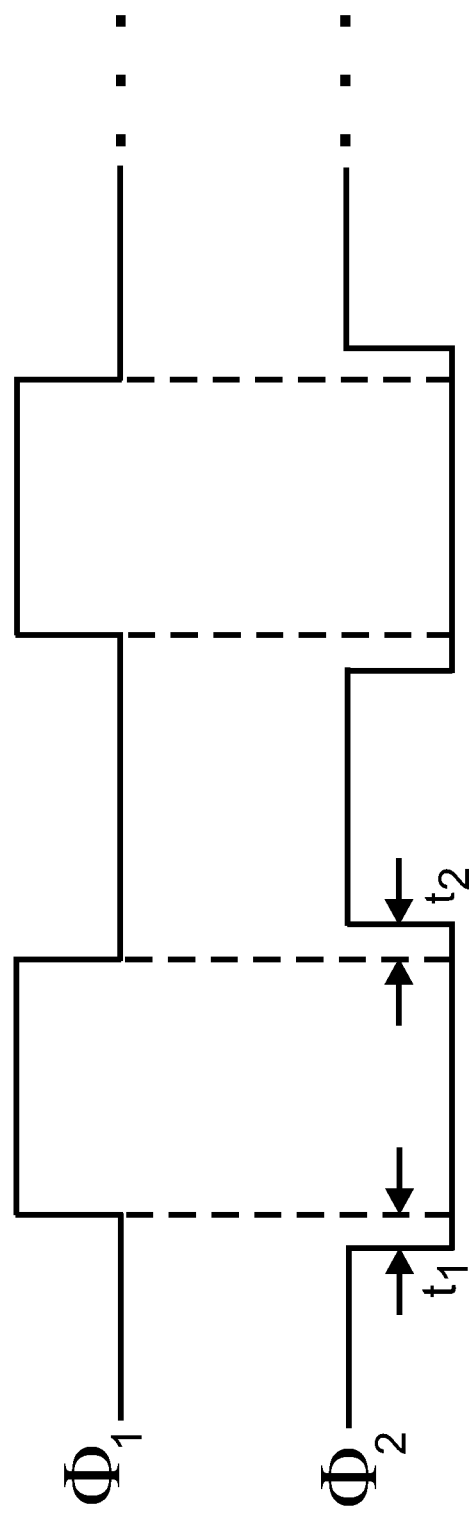
FIG. 4 depicts an exemplary set of switch control signals for the charge pump of FIG. 3.

A control signal, say, $\Phi_1$, controls switches 50 and 56. A complementary control signal, say, $\Phi_2$, controls switches 52 and 54. FIG. 4 shows an exemplary set of switch control signals for charge pump 20. Note that control signals $\Phi_1$ and $\Phi_2$ are not exactly complementary in order to avoid a crowbar current through charge pump 20. More specifically, time periods (e.g., dead-time) labeled as $t_1$ and $t_2$, added between the edges of control signals $\Phi_1$ and $\Phi_2$, prevent switches 50, 52, 54, and 56 from conducting at the same time. (Conduction by switches 50, 52, 54, and 56 at the same time would effectively short $V_s$ to ground.)

In exemplary embodiments, control signals $\Phi_1$ and $\Phi_2$ may have a desired frequency. In some embodiments, control signals $\Phi_1$ and $\Phi_2$ may have a frequency of 32.768 kHz, a frequency commonly used for RTCs. As persons of ordinary skill in the art understand, however, other frequencies may be used in other embodiments, depending on factors such as design and performance specifications, etc., for a given implementation.

Figure 5:
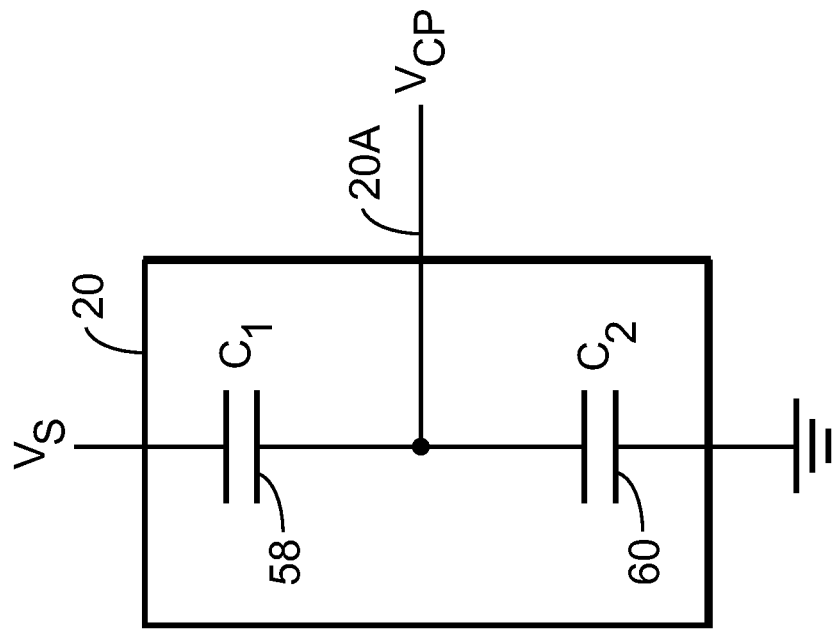
FIG. 5 illustrates an equivalent circuit diagram for the charge pump of FIG. 3 during one phase of operation.

Referring to FIGS. 3 and 4, when control signal $\Phi_1$ is at a high level, switches 50 and 56 turn on, and couple capacitors 58 and 60 in series between $V_s$ and ground. As a result, capacitors 58 and 60 charge. During this phase of operation, the node between capacitors 58 and 60 constitutes output 20A of charge pump 20. While control signal $\Phi_1$ is at a high level, control signal $\Phi_2$ is at a low level, which causes switches 52 and 54 to be off. FIG. 5 shows the resulting circuit topology for this phase of operation of charge pump 20.

Figure 6:
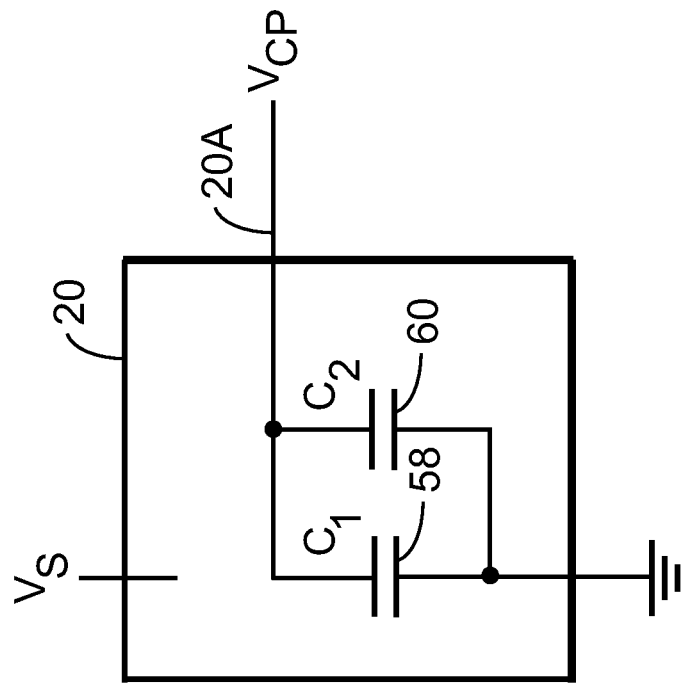
FIG. 6 depicts an equivalent circuit diagram for the charge pump of FIG. 3 during another phase of operation.

Referring to FIGS. 3 and 4, when control signal $\Phi_2$ is at a high level, switches 52 and 54 turn on, and couple capacitors 58 and 60 in parallel between output 20A of charge pump 20 and ground. Thus, during this phase of operation, the coupled top terminals (the terminals not coupled to ground) of the capacitors constitute output 20A of charge pump 20. While control signal $\Phi_2$ is at a high level, control signal $\Phi_1$ is at a low level, which causes switches 50 and 56 to be off. FIG. 6 shows the resulting circuit topology for this phase of operation of charge pump 20.

Referring back to FIG. 3, during steady-state operation, a high level of control signal $\Phi_2$ forces the same voltage ($B_{cp}$) across capacitors 58 and 60. It may be shown that in steady state operation, the output voltage is approximately ½ the input voltage of charge pump 20. In other words, $$V_{cp} \approx \frac{1}{2} V_s. \qquad \text{(Eq. 1)}$$

Note that, as Equation 1 shows, the steady-state voltage conversion ratio of charge pump 20, i.e., the ratio of $V_{cp}$ to $V_s$, does not depend on the capacitances of capacitors 58 and 60.

In exemplary embodiments, using a charge pump as shown in FIG. 3 can achieve power conversion or transfer efficiencies of roughly 80%. As such, charge pump 20 exhibits a "transformer effect," as its efficiency of 80% (0.8) is greater than the ratio of its output to input voltages, i.e., the ratio of the ratio of $V_{cp}$ to $V_s$, which is about 0.5, as Equation 1 states. Thus, charge pump 20 provides better power efficiency than a conventional linear voltage regulator.

Figure 7:
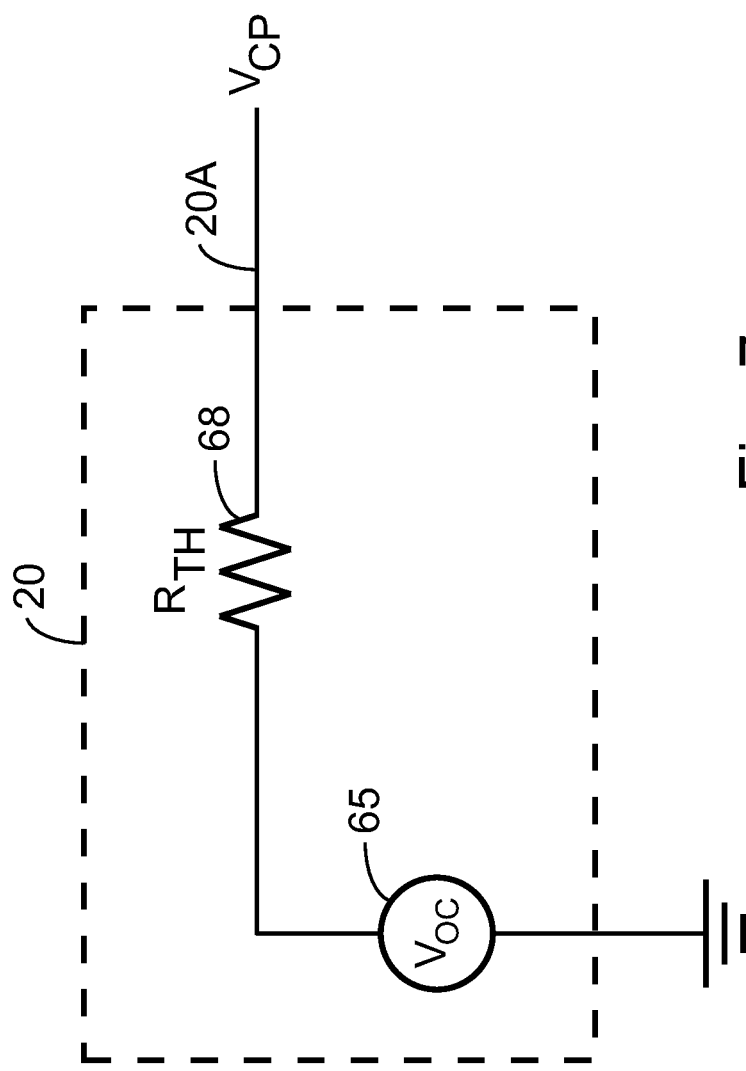
FIG. 7 shows a Thévenin equivalent circuit diagram for the charge pump of FIG. 3.

Furthermore, charge pump 20 reduces the current drawn from source 15 (see FIG. 1). A Thévenin equivalent circuit of charge pump 20, illustrated in FIG. 7, helps to illustrate this attribute. More specifically, the Thévenin equivalent circuit includes a voltage source 65 with a magnitude $V_{oc}$ (open-circuit output voltage), and a resistance 68, with a resistance value $R_{TH}$. Referring to FIG. 3, assuming that charge pump 20 includes a parasitic capacitor, $C_p$, between node 62 and ground, one may show that:

$$V_{oc} = V_s \cdot \frac{C_2 + C_p}{(2C_2 + C_p)} \approx \frac{V_s}{2}, \qquad \text{(Eq. 2)}$$

and $$R_{TH} = \frac{C_2 + C_p}{(2C_2 + C_p)} \cdot \frac{C_1 + C_2 + C_p}{2fC_1(C_1 + C_2)} \approx \frac{1}{4fC_1}, \qquad \text{(Eq. 3)}$$

where f represents the switching or clock frequency of charge pump 20.

Using $P_{LOSS}$ to denote power loss in charge pump 20, Equation 4 expresses the relationship between the input power ($P_{IN}$) and output power ($P_{OUT}$) of charge pump 20:

$$P_{IN} = P_{OUT} + P_{LOSS}. \qquad \text{(Eq. 4)}$$

Given that:

$$P_{IN} = I_s \cdot V_s,$$

$$P_{OUT} = I_{OUT} \cdot V_{CP},$$

and $$P_{LOSS} = I_{OUT}^2 \cdot R_{TH},$$

where $I_S$ and $I_{OUT}$ denote, respectively the input and output currents of charge pump 20, one may express Equation 4 as:

$$I_s \cdot V_s = I_{OUT}(V_{OC} - I_{OUT} \cdot R_{TH}) + I_{OUT}^2 \cdot R_{TH} = I_{OUT} \cdot V_{OC},$$

and finally as:

$$I_S = I_{OUT} \cdot \frac{V_{OC}}{V_s} = I_{OUT} \cdot \frac{C_2 + C_p}{2C_2 + C_p} \approx \frac{I_{OUT}}{2}. \quad \text{(Eq. 5)}$$

As Equation 5 illustrates, the transformer effect of charge pump 20 reduces the current drawn from source 15 by a factor of about 2, i.e., the inverse of the voltage conversion ratio, which is roughly 0.5.

In addition to the transformer effect, charge pump 20 reduces the current drawn from source 15 during the low power or sleep mode of operation in another way. Specifically, supplying a reduced voltage ($V_{CP}$) to circuits 25 (see FIGS. 1-2) reduces the supply current that those circuits draw (compared to supplying those circuits with $V_s$). The reduced supply voltage also reduces the static leakage current of circuits 25, thus additionally reducing the current draw from source 15.

Referring to FIGS. 2A and 3, in some embodiments the function of MUX 40 can be performed by charge pump 20. For example, the voltage $V_s$ can be coupled to voltage $V_{CP}$ by closing switches 50 and 52 in FIG. 3. In this configuration, an advantage is provided by using capacitor 60 as decoupling for the voltage ($V_{CP}$) at output 20A of charge pump 20. Furthermore, such an embodiment can provide an additional advantage by configuring switches 54 and 56 such that capacitor 58 is connected in parallel with capacitor 60, thereby using both capacitors 58 and 60 as decoupling for the voltage ($V_{CP}$) at output 20A of charge pump 20.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An apparatus, comprising:
 a first set of circuits adapted to operate in a first mode of operation of the apparatus;
 a second set of circuits adapted to operate in a second mode of operation of the apparatus, wherein a power consumption of the apparatus is lower in the second mode of operation of the apparatus than in the first mode of operation of the apparatus; and
 a charge pump adapted to convert a first supply voltage of the apparatus to a second supply voltage, wherein the second supply voltage powers the second set of circuits.

2. The apparatus according to claim 1, wherein the first supply voltage powers the first set of circuits in the first mode of operation of the apparatus.

3. The apparatus according to claim 1, wherein the second set of circuits is further adapted to operate in the first mode of operation of the apparatus.

4. The apparatus according to claim 1, wherein the first mode of operation of the apparatus comprises a normal or active mode of operation.

5. The apparatus according to claim 4, wherein the second mode of operation of the apparatus comprises a low power or sleep mode of operation.

6. The apparatus according to claim 1, wherein the second supply voltage selectably powers the second set of circuits.

7. The apparatus according to claim 1, wherein one of the first and second supply voltages selectably powers the second set of circuits depending on at least one of a magnitude of the first supply voltage and a magnitude of the second supply voltage.

8. An apparatus, comprising:
 a battery;
 a microcontroller unit (MCU), comprising:
  a charge pump coupled to the battery, the charge pump adapted to convert a voltage of the battery to a supply voltage, wherein the supply voltage is lower than the battery voltage;
  a first set of circuits adapted to be powered by the battery during a normal operating mode of the MCU; and
  a second set of circuits coupled to the charge pump, the second set of circuits adapted to be powered by the supply voltage during a low-power operating mode of the MCU.

9. The apparatus according to claim 8, wherein the second set of circuits is further adapted to be powered by the supply voltage during the normal operating mode of the MCU.

10. The apparatus according to claim 8, wherein the second set of circuits comprises a liquid crystal display (LCD) coupled to the MCU, the LCD adapted to display information in response to requests from the MCU.

11. The apparatus according to claim 8, wherein the second set of circuits comprises at least one of a memory, a universal asynchronous receiver transmitter (UART), a register, and a real time clock (RTC) circuit.

12. The apparatus according to claim 8, wherein the charge pump comprises first and second pairs of switches coupled to first and second capacitors.

13. The apparatus according to claim 12, wherein the first pair of switches is controlled by a first control signal, and the second pair of switches is controlled by a second control signal.

14. The apparatus according to claim 13, wherein one of the battery and the charge pump selectably powers the second set of circuits depending on at least one of a magnitude of the voltage of the battery and a magnitude of the supply voltage.

15. A method of operating an apparatus, the method comprising:
 converting, by using a charge pump, a first supply voltage of the apparatus to a second supply voltage;
 operating a first set of circuits in a first mode of operation of the apparatus; and
 operating a second set of circuits in a second mode of operation of the apparatus, using the second supply voltage to power the second set of circuits, wherein a power consumption of the apparatus is lower in the second mode of operation of the apparatus than in the first mode of operation of the apparatus.

16. The method according to claim 15, wherein operating the first set of circuits in the first mode of operation of the apparatus further comprises powering the first set of circuits during the first mode of operation of the apparatus with the first supply voltage.

17. The method according to claim 15, further comprising operating the second set of circuits in the first mode of operation of the apparatus.

18. The method according to claim 15, wherein the first mode of operation of the apparatus comprises a normal or active mode of operation.

19. The method according to claim 18, wherein the second mode of operation of the apparatus comprises a low power or sleep mode of operation.

20. The method according to claim 19, wherein operating a second set of circuits in a second mode of operation of the apparatus further comprises selectably using one of the first and second supply voltages to power the second set of circuits depending on at least one of a magnitude of the first supply voltage and a magnitude of the second supply voltage.

\* \* \* \* \*